(12) United States Patent
Yamaura

(10) Patent No.: US 11,646,245 B2
(45) Date of Patent: May 9, 2023

(54) WATERPROOF CASING WITH A SEALING GROMMET IN A CASTING HOLE

(71) Applicant: DENSO CORPORATION, Kariya (JP)

(72) Inventor: Satoshi Yamaura, Kariya (JP)

(73) Assignee: DENSO CORPORATION, Kariya (JP)

( * ) Notice: Subject to any disclaimer, the term of this patent is extended or adjusted under 35 U.S.C. 154(b) by 612 days.

(21) Appl. No.: 16/574,134

(22) Filed: Sep. 18, 2019

(65) Prior Publication Data
US 2020/0161213 A1 May 21, 2020

(30) Foreign Application Priority Data
Nov. 15, 2018 (JP) ............................. JP2018-214814

(51) Int. Cl.
*H01L 23/433* (2006.01)
*H01L 23/427* (2006.01)
*H01L 25/07* (2006.01)

(52) U.S. Cl.
CPC ........ *H01L 23/4332* (2013.01); *H01L 23/427* (2013.01); *H01L 25/074* (2013.01)

(58) Field of Classification Search
CPC ............... H01L 23/4332; H01L 23/427; H01L 25/074
USPC ...................................................... 206/710
See application file for complete search history.

(56) References Cited

U.S. PATENT DOCUMENTS

| | | | |
|---|---|---|---|
| 5,540,450 A | 7/1996 | Hayashi et al. | |
| 5,811,728 A * | 9/1998 | Maeda | H02G 3/088 174/152 G |
| 6,462,666 B1 * | 10/2002 | Einck | C02F 3/006 361/752 |
| 2002/0040802 A1 * | 4/2002 | Yasuda | H01R 13/5208 174/650 |
| 2009/0302034 A1 | 12/2009 | Makela et al. | |
| 2011/0180319 A1 * | 7/2011 | Nagata | F16J 15/106 174/668 |
| 2012/0321489 A1 * | 12/2012 | Murakami | F04D 29/106 417/364 |
| 2017/0373429 A1 * | 12/2017 | Uchiyama | H01R 13/5208 |

FOREIGN PATENT DOCUMENTS

| JP | H07-4334 A | 1/1995 |
|---|---|---|
| JP | 2016-119750 A | 6/2016 |

* cited by examiner

*Primary Examiner* — Sheng-Bai Zhu
(74) *Attorney, Agent, or Firm* — Oliff PLC

(57) ABSTRACT

The waterproof casing has a housing and a grommet. The grommet is disposed in a hole of the housing. The grommet has a body, a flange, and a lip. The flange extends radially outward from the body. The lip protrudes from an outer peripheral part of the body and extends in a circumferential direction. The lip has a high compression portion in contact with a wall surface of the hole and a low compression portion adjacent to the high compression portion at a further side from the flange. The low compression portion has a lower compressed state than the high compression portion. The housing has a recess to allow the low compression portion to escape radially outward.

19 Claims, 6 Drawing Sheets

WATERPROOF CASING WITH A SEALING GROMMET IN A CASTING HOLE

CROSS REFERENCE TO RELATED APPLICATION

This application is based on Japanese Patent Application No. 2018-214814 filed on Nov. 15, 2018, the disclosure of which is incorporated herein by reference in its entirety.

TECHNICAL FIELD

The present disclosure relates to a waterproof casing having a grommet.

BACKGROUND

A waterproof casing has a housing and a grommet. The rubber grommet is disposed to cover a hole of the housing. The hole passes through the housing and connects a surface and an opposite surface of the housing. The grommet has a body and a lip located along an outer peripheral part of the body. The lip is tightly in contact with a wall of the hole and seals a gap between the grommet and the housing.

SUMMARY

A waterproof casing of the present disclosure has a housing having a hole, and a grommet configured to cover the hole. The grommet has elasticity. The hole passes through the housing and connects a surface and an opposite surface. The grommet is disposed in an axial direction of the hole. The grommet has a body, a flange extended radially outward from the body, and a lip protruded from an outer surface of the body and extended in a circumferential direction. The flange faces either of an outer surface or an inner surface of the housing. The lip has a high compression portion and a low compression portion. The high compression portion is in contact with a wall surface of the hole with compressed. The low compression portion is adjacent to the high compression portion at a further side from the flange in the axial direction. The low compression portion has a lower compressed state than the high compression portion. The housing has an escape space that allows the low compression portion to escape radially outward. The escape space is adjacent to a contact part of the wall surface at the further side from the flange.

The contact part is in contact with the high compression portion.

DETAILED DESCRIPTION

Figure 1:
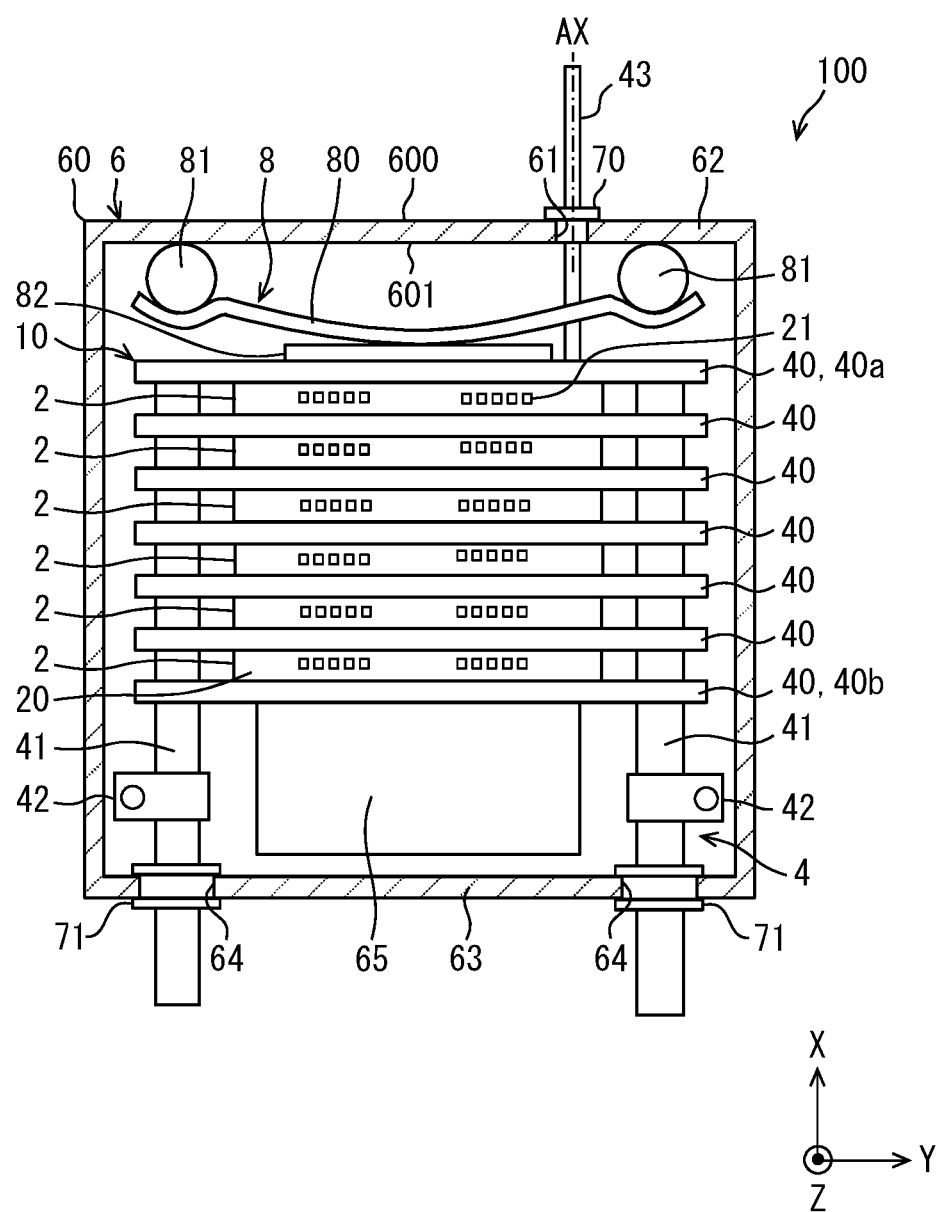
FIG. 1 is a cross section view of a part of a power converter having a waterproof casing in accordance with the first embodiment.

To begin with, examples of relevant techniques will be described.

A waterproof casing has a housing and a grommet. The rubber grommet is disposed to cover a hole of the housing. The hole passes through the housing and connects a surface and an opposite surface of the housing. The grommet has a body and a lip located along an outer peripheral part of the body. The lip is tightly in contact with a wall of the hole and seals a gap between the grommet and the housing.

A grommet having a flange has been known. The flange is disposed to extend radially outward from a body. The flange faces either of an inner surface or an outer surface of the housing. Such grommet may be displaced when external force such as thermal stress influences the grommet in a slipping off direction. The slipping off direction is an axial direction of a hole. Specifically, a component held by the grommet changes its position and the flange moves away from the housing. The displacement can cause a deterioration of a waterproof property and the slipping off of the grommet.

The purpose of the present disclosure is to provide a waterproof casing that suppresses the displacement of the grommet in the slipping off direction.

The present disclosure adopts technical features described later to achieve the purpose. A symbol with brackets shows a correspondence to a concrete means in embodiments described later and this does not limit a technical range of the present disclosure.

A waterproof casing of the present disclosure has a housing having a hole, and a grommet configured to cover the hole. The grommet has elasticity. The hole passes through the housing and communicates a surface and an opposite surface. The grommet is disposed in an axial direction of the hole. The grommet has a body, a flange extended radially outward from the body, and a lip protruded from an outer surface of the body and extended in a circumferential direction. The flange faces either of an outer surface or an inner surface of the housing. The lip has a high compression portion and a low compression portion. The high compression portion is in contact with a wall surface of the hole with compressed. The low compression portion is adjacent to the high compression portion at a further side from the flange in the axial direction. The low compression portion has a lower compressed state than the high compression portion. The housing has an escape space that allows the low compression portion to escape radially outward. The escape space is adjacent to a contact part of the wall surface at the further side from the flange. The contact part is in contact with the high compression portion.

The escape space of this waterproof casing can partially release a compressed state of the grommet. This generates a difference of the compressed state in the grommet, which further generates a holding power at a border between the low compression portion and the high compression portion. In addition, the low compression portion escapes radially outward and acts as an anchor. The low compression portion is adjacent to the high compression portion at the further side from the flange. Thus, the waterproof casing suppresses the displacement in the slipping off direction.

Embodiments of the present disclosure will be described hereafter referring to drawings. In the embodiments, a part that functionally and/or structurally corresponds and/or relates to a matter described in a preceding embodiment may be assigned with the same reference numeral. A part that corresponds and/or relates to a matter in an embodiment may be described in other embodiments.

First Embodiment

A waterproof casing is applied to a device such as an electronic device and an electric device. The waterproof casing provides a space to house components, such as an electronic component and an electric component. The waterproof casing may be applied to a power converter device of a vehicle. At first, an outline structure of the power converter including the waterproof casing is explained.

Outline Structure of the Power Converter

The power converter device 100 has a semiconductor device 2, a cooling system 4, a waterproof casing 6, and a pressing member 8 as shown in FIG.1. The waterproof casing 6 includes a housing 60. The housing 60 is shown as a cross section view and other components are shown as a plan view in FIG. 1 to show inside the housing.

The waterproof casing 6 houses the semiconductor device 2. The semiconductor device 2 configures an electric converter such as an inverter and a converter. The power converter device 100 has a plurality of semiconductor devices 2. The semiconductor device 2 has a semiconductor chip (not shown). The semiconductor chip has a vertical element such as IGBT and MOSFET. The semiconductor chip has main electrodes of the elements on both surfaces in a X direction. The X direction is a thickness direction of the semiconductor chip. The semiconductor chip is sealed with an encapsulation resin 20. The encapsulation resin 20 may be made of epoxy resin. The encapsulation resin 20 is formed by transfer molding. The semiconductor device 2 is configured to release heat from the both surfaces in the X direction. The semiconductor device 2 is called power card.

The semiconductor device 2 has a pair of an upper arm circuit and a lower arm circuit as one package. The semiconductor device 2 has an upper arm chip configuring the upper arm circuit and a lower arm chip configuring the lower arm circuit as semiconductor chips. The semiconductor device has a 2in1 package structure. The power converter device 100 in this embodiment has six semiconductor devices 2. The six semiconductor devices 2 form two pairs of a three-phase invertor.

The semiconductor device 2 also has a signal terminal 21 and a main terminal (not shown) as terminals for external connection. The signal terminal 21 is electrically connected to a signal pad formed at the semiconductor chip. The semiconductor chip has a plurality of pads including a gate pad. The signal terminal 21 extends in a Z direction in FIG.1 and protrudes outward from one of side surfaces of the encapsulation resin 20. The signal terminal 21 is electrically connected to a circuit base (not shown), for example.

Each semiconductor device 2 has three main terminals. One of the main terminals is a power terminal at a high potential side and called P terminal. Another main terminal is a power terminal at a low potential side and called N terminal. The other main terminal is an output terminal for a rotary electric machine (not shown) and called O terminal. The three terminals extend in the Z direction and protrude outward from a side surface of the encapsulation resin 20 that is opposite to where the signal terminal 21 is located. The power terminal is connected to an element at a direct current power, such as a smooth capacitor, through a bus bar (not shown). The output terminal is connected to a three-phase winding wire of the rotary electric machine through a bus bar (not shown).

The cooling system 4 is formed with metal having a good thermal conductivity, such as aluminum. The cooling system 4 has a heat exchanger 40 and a pipe 41. The heat exchanger 40 is located in the waterproof casing 6. The heat exchanger 40 has a flat tubular shape. The heat exchanger 40 may be formed as follows. At least one out of a pair of metal plates is pressed to expand in the X direction. The edges of the plate are fixed to the edges of the other plate by caulking and sealed by soldering. Thus, the pair of the plates forms a passage through which a refrigerant flows, which is usable as the heat exchanger 40.

In this embodiment, the semiconductor device 2 and the heat exchanger 40 are stacked one after another to cool the semiconductor device 2 that generates heat while running. The semiconductor device 2 and the heat exchanger 40 form a multilayer 10. The semiconductor device 2 and the heat exchanger 40 are aligned in the X direction. The semiconductor device 2 is located between the heat exchangers 40 in the X direction. Both ends of the multilayer 10 in the X direction have the heat exchangers 40.

The pipe 41 is disposed from outside to inside the waterproof casing 6. The cooling system 4 has two pipes 41. Each pipe 41 may be configured with one part or plural parts connected with each other. The two pipes 41 are connected to the heat exchangers 40 separately. The refrigerant is supplied to one of the pipes 41 by a pump (not shown) and flows through the passage of the stacked heat exchangers 40. The refrigerant cools the semiconductor device 2 that configures the multilayer 10. The refrigerant that flows through the heat exchanger 40 is discharged through the other pipe 41.

The refrigerant may change its phase like water and ammonia and the refrigerant may not change its phase like ethylene glycol. The main function of the cooling system 4 is cooling the semiconductor device 2. In addition to the cooling function, the cooling system 4 may have a heating function used when an environmental temperature is low. In this case, the cooling system 4 is called temperature regulating system. The refrigerant is called heating medium.

The cooling system 4 also has an attachment member 42 and a pipe 43. The attachment member 42 attaches the pipe 41 to the waterproof casing 6. The pipe 41 is fixed in the waterproof casing 6 at further side from the pressing member 8. The pipe 41 is fixed in the housing 60 of the waterproof casing 6 and located between an outermost heat exchanger 40b (described later) and a grommet 71. The attachment member 42 may be a cramp. The attachment member 42 is fixed to the housing 60 with screws over the pipe 41. Each pipe 41 has the attachment member 42.

The pipe 43 is connected to an outermost heat exchanger 40a of the heat exchangers 40. The outermost heat exchanger 40a is pressed by the pressing member 8. The pipe 43 is connected to a surface of the outermost heat exchanger 40a that is pressed by the pressing member 8. The outermost heat exchanger 40b is the other outermost heat exchanger of the heat exchangers 40, which is located opposite to the outermost heat exchanger 40a. When the power converter 100 is disposed in the vehicle so that the outermost heat exchanger 40a is located vertically upper than the outermost heat exchanger 40b, air may be left in the outermost heat exchanger 40a. The power converter 100 in this embodiment allows the left air in the outermost heat exchanger 40a to escape to outside the power converter 100 through the pipe 43 while attached in the vehicle and flowing the refrigerant. This allows the cooling system 4 to remove air.

The waterproof casing 6 has the housing 60 and the grommet 70. The grommet 70 has a high compression portion and a low compression portion (described later). The housing 60 provides a housing space. The housing 60 may be configured with one component or plural components joined together. The plural components are sealed with a sealing member (not shown).

The housing 60 is box-shaped. The housing 60 has a hole 61. The hole 61 passes through the housing 60 and connects an outer surface 600 and an inner surface 601 opposite to the outer surface 600 of the housing 60. The outer surface 600 corresponds to one surface for example, and then the inner surface 601 corresponds to a reverse surface. The pipe 43 passes through the hole 61. The pipe 43 corresponds to an insertion member. When the housing 60 is configured with the plural components joined together and forms an opening that passes through the housing 60, the opening corresponds to the hole.

The housing 60 may be produced by aluminum die casting. The housing 60 in accordance with this embodiment is approximately rectangular parallelepiped. The hole 61 may be formed by a cutting tool. An axial direction, a radial direction, and a circumferential direction are defined by the hole 61. A center axis AX is a center axis of a ring surface that forms the hole 61. The center axis AX approximately agrees with a center axis of the pipe 43 that passes through the hole 61. The axial direction is a direction along the center axis AX. The X direction in this embodiment is approximately the same or parallel with the axial direction.

The grommet 70 has elasticity and is attached to the housing 60 to cover the hole 61. The grommet 70 holds the pipe 43 inserted in the hole 61. The grommet 70 water-tightly seals a gap between the housing 60 and the pipe 43. The grommet 70 is also called seal member.

The waterproof casing 6 also has the grommets 71. The housing 60 has two holes 64 at a side wall 63 opposite to the side wall 62. Each pipe 41 passes through the corresponding hole 64. The grommets 71 have elasticity and are attached to the housing 60 to cover the holes 64. The grommets 71 hold the pipes 41 inserted in the holes 64. The grommets 71 water-tightly seal gaps between the housing 60 and the pipes 41. The grommets 71 water-tightly seal the holes 64.

The housing 60 has a supporter 65 that supports the multilayer 10 in the X direction. The supporter 65 supports the multilayer 10 that is pressed by the pressing member 8 in the X direction. The housing 60 in this embodiment has a projection that protrudes from the inner surface 601 as the supporter 65. The supporter 65 may be located at a bottom wall of the housing 60. The multilayer 10 is fixed and positioned in the X direction with the supporter 65 and the two attachment members 42.

The pressing member 8 has an elastic member 80, a supporting member 81, and a plate 82. The elastic member 80 is located between the side wall 62 of the housing 60 and the multilayer 10. The elastic member 80 supports the multilayer 10 fixed in the housing 60. The elastic member 80 in this embodiment is a plate spring that is curved. The elastic member 80 may be a rubber that produces pressure by elastic deformation in place of a metal spring.

The supporting member 81 is located between the elastic member 80 and the side wall 62. The pressing member 8 has two supporting members 81. The two supporting members 81 are aligned in the Y direction and separated from each other. The two supporting members 81 support both ends of the elastic member 80. The elastic member 80 presses the multilayer 10 at the center in the Y direction. The supporting members 81 may be fixed to a bottom surface of the housing 60. The supporting members 81 support the elastic member 80 in a state of floating from the bottom surface.

The plate 82 has a plate shape. The plate 82 is located between the elastic member 80 and the multilayer 10. A surface of the plate 82 is in contact with a surface of the outermost heat exchanger 40a. The elastic member 80 presses the multilayer 10 through the plate 82. Detail structure of the grommet 70

Figure 2:
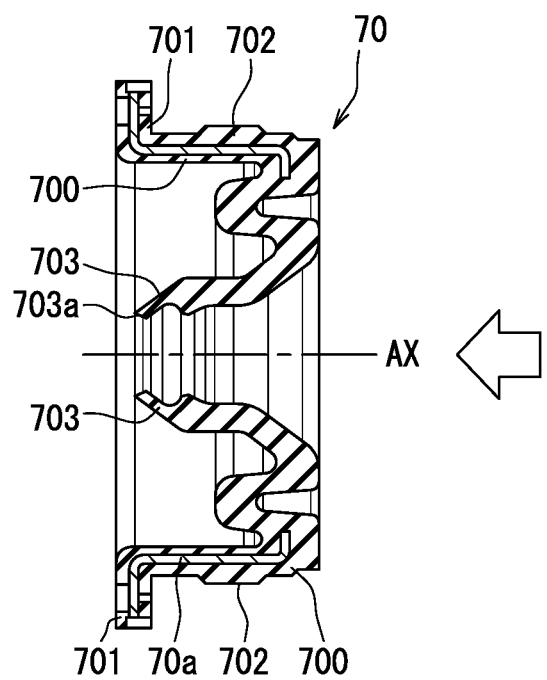
FIG. 2 is a cross section view of a grommet.

The grommet 70 is made of an elastic material, such as a rubber. As shown in FIG. 2, the grommet 70 has a reinforcing member 70a inside, which is made of metal such as iron. The grommet 70 is integrally molded with containing the reinforcing member 70a. The grommet 70 has a body 700, a flange 701, a lip 702, and a bellows 703.

The body 700 extends in the axial direction and at least a part of the body 700 is disposed in the hole 61. The body 700 in this embodiment has a tube shape. To be concrete, the body 700 has an approximately circle tube shape. Such body 700 is called tubular part.

The flange 701 extends radially outward from the body 700. The flange 701 faces either of the outer surface 600 or the inner surface 601 of the housing 60. The flange 701 in this embodiment extends radially outward from an end of the body 700, concretely an end of the body 700 adjacent to the outer surface 600. The flange 701 faces the outer surface 600. The flange 701 is caught on the outer surface 600 when the grommet 70 is deformed inward the housing 60 in the X direction. Thus, the flange 701 acts as a stopper. The reinforcing member 70a is disposed to extend along both of the body 700 and the flange 701.

The lip 702 seals around the hole 61 of the housing 60. The lip 702 protrudes from the outer surface of the body 700 and extends in the circumferential direction. The protruding lip 702 is disposed continuously around an outer peripheral part of the body 700. The lip 702 is disposed so that the lip 702 seals an inner peripheral part of the wall surface of the hole 61. The outer surface of the body 700 has one lip 702 in the axial direction.

In this embodiment, the cross section of the lip 702 taken along with the parallel surface in the axial direction is approximately trapezoidal shape. The top surface of the tip end of the lip 702 before attaching to the housing 60 is approximately parallel in the axial direction. The lip 702 is located around the center of the body 700 in the axial direction. The lip 702 overlaps the reinforcing member 70a in the radial direction. The lip 702 is entirely disposed in the hole 61.

The bellows 703 seals around the pipe 43. The bellows 703 extends radially inward from the body 700. The bellows 703 is capable of expansion and contraction in the axial direction. The bellows 703 has a tube shape, which makes an opening. The pipe 43 passes through the opening of the bellows 703. In the grommet 70 before compression, an opening width 703a of the opening of the bellows 703 is slightly smaller than an outer diameter of the pipe 43. Thus, when the pipe 43 is inserted to the opening in the arrow direction in FIG.2, the bellows 703 is deformed elastically and is tightly in contact with the pipe 43. The bellows 703 is compressed and deformed and tightly and entirely in contact with an outer peripheral surface of the pipe 43.

Fixed Structure of the Grommet 70

Figure 3:
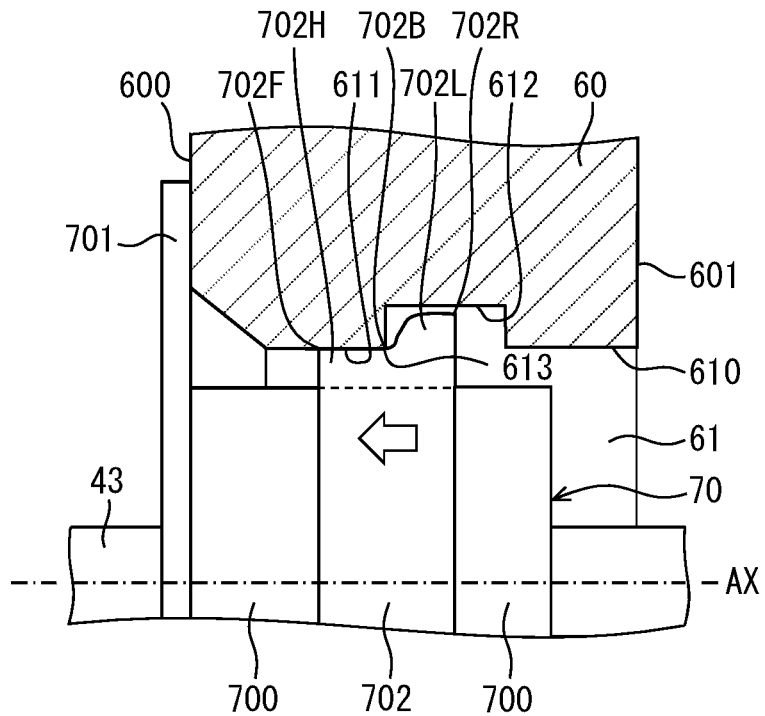
FIG. 3 is a cross section view of a fixed structure of a grommet.

FIG. 3 illustrates a fixed structure in which the grommet 70 is fixed into the hole 61. FIG. 3 is a cross section view of the housing 60 to explain the internal structure of the grommet 70 in the hole 61.

The lip 702 of the grommet 70 has a high compression portion 702H and a low compression portion 702L. The high compression portion 702H is tightly in contact with the wall surface 610 of the hole 61 with compressed in the radial direction. The wall surface 610 is called inner peripheral surface. The high compression portion 702H of the grommet 70 is compressed after being attached into the hole 61. The high compression portion 702H is tightly in contact with a contact part 611 of the wall surface 610.

The low compression portion 702L is adjacent to the high compression portion 702H at a further side from the flange 701 in the axial direction. In other words, the high compression portion 702H is located between the flange 701 and the low compression portion 702L in the axial direction. The low compression portion 702L has a lower compressed state than the high compression portion 702H. The compression ratio of the low compression portion 702L is smaller than that of the high compression portion 702H.

The housing 60 has a recess 612 on the wall surface 610. The recess 612 is recessed from the wall surface 610. The wall surface 610 continuously has the recess 612 along the wall surface 610 in the circumferential direction. The recess 612 may be called groove. The recess 612 is adjacent to the contact part 611 at the further side from the flange 701 in the axial direction. The recess 612 in this embodiment is adjacent to the contact part 611 at the further side from the outer surface 600.

The recess 612 provides a step in the wall surface 610. The recess 612 overlaps the low compression portion 702L in the radial direction. The recess 612 allows a part of the lip 702 overlapping with the recess 612 to escape radially outward from the contact part. The part of the lip 702 that escapes in the recess 612 is relieved from the compressed state. This forms the low compression portion 702L, which has a lower compressed state than the high compression portion 702H. The low compression portion 702L is located in the recess 612 and is located radially outward of the contact part 611. The recess 612 provides a space to release the low compression portion 702L radially outward, or a space to relief the compressed state. The recess 612 corresponds to an escape space.

The low compression portion 702L in this embodiment is not in contact with the wall surface 610, or the housing 60. The lip 702 has an end 702F adjacent to the flange 701 and an end 702R opposite to the end 702F and further from the flange 701. The low compression portion 702L includes the end 702R. The end 702R of the low compression portion 702L is free from other parts in the axial direction. This makes a non-compressed state for the low compression portion 702L. A part of the lip 702 adjacent to the end 702F is the high compression portion 702H and the left part adjacent to the end 702R is the low compression portion 702L. The lip 702 has the high compression portion 702H and a low compression portion 702L that are adjacent to each other as one set.

The flange 701 faces the outer surface 600 of the housing 60 as described before. The arrow in FIG. 3 shows a slipping off direction, which is a direction where the grommet 70 slips off from the housing 60. External stress sometimes affects the pipe 43 held by the grommet 70 and influences the grommet 70 in the slipping off direction. External stress may be heat stress of components in the waterproof casing 6. The multilayer 10 in this embodiment is fixed at the side wall 63 with the attachment member 42 and the supporter 65. When the multilayer 10 expands in the X direction based on a difference of the coefficient of linear expansion between the semiconductor device 2 and the heat exchanger 40, stress affects in the X direction opposite to the side wall 63, or in the slipping off direction.

In this embodiment, the wall surface 610 of the hole 61 has the recess 612 to make a part of the lip 702 free. Releasing the low compression portion 702L inside the recess 612 lowers the compressed state of the low compression portion 702L than the high compression portion 702H. This partially generates a difference in the compressed state in the lip 702. The lip 702 having the difference in the compressed state allows the housing 60 to hold the grommet 70 more tightly compared with a lip having an even compressed state. The holding power occurs at a border 702B between the high compression portion 702H and the low compression portion 702L. The border 702B is an edge of the high compression portion 702H adjacent to the low compression portion 702L.

The low compression portion 702L goes into the recess 612 and escapes radially outward. The low compression portion 702L is located radially outward of the contact part 611. The low compression portion 702L protruding over the high compression portion 702H acts as an anchor.

The border 702B is tightly contact with a corner 613 of the housing 60 between the contact part 611 and the recess 612. The holding power enforced by the difference of the compressed state acts on the corner 613. The border 702B is tightly in contact with the corner 613. The corner 613 is located between the flange 701 and the low compression portion 702L having the anchor function. The corner 613 is adjacent to the anchor. The low compression portion 702L having the anchor function is in contact with the corner 613 in a condition in which stress does not act on the low compression portion 702L in the slipping off direction. Even if stress affects in the slipping off direction, the low compression portion 702L has a big holding power and acts as the anchor. This suppresses the displacement of the grommet 70. This further suppresses the deterioration of the sealing property of the grommet 70 and slipping off of the grommet 70 from the housing 60.

According to this embodiment, the low compression portion 702L is free from and is not in contact with the housing 60. This makes a bigger difference of the compression ratio between the low compression portion 702L and the high compression portion 702H, and enforces the holding power.

The low compression portion 702L includes the free end 702R of the lip 702. The low compression portion 702L is in the non-compressed state. This makes a bigger difference of the compressed state between the low compression portion 702L and the high compression portion 702H and enforces the holding power. The recess 612 having comparatively shallow depth can free the end 702R and make the low compression portion 702L non-compressed.

The present disclosure is not limited to the waterproof casing whose flange 701 faces to the outer surface 600 of the housing 60. The flange 701 may face the inner surface 601. In this case, the recess 612 is disposed between the outer surface 600 and the contact part 611.

The present disclosure is not limited to the waterproof casing whose low compression portion 702L is not in contact with the housing 60. The low compression portion 702L may be in contact with the housing 60, for example the bottom surface of the recess 612. This also allows the low compression portion 702L to escape in the recess 612 and lowers the compressed state of the low compression portion 702L than the high compression portion 702H. The holding power can be increased when the low compression portion 702L is free and in the non-compressed state.

Second Embodiment

The second embodiment is a variation based on the preceding embodiment. The waterproof casing in the preceding embodiment has the recess 612 in the wall surface 610 of the hole 61. A step 614 is provided in the second embodiment in place of the recess 612.

Figure 4:
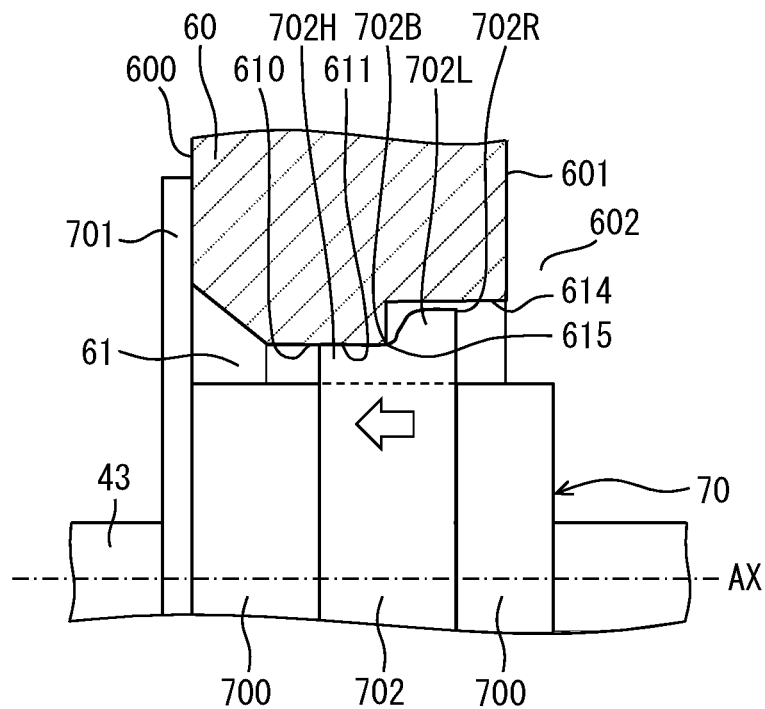
FIG. 4 is a cross section view of a fixed structure of a grommet in a waterproof casing in accordance with the second embodiment.

FIG. 4 is the fixed structure of the grommet 70. FIG. 4 corresponds to FIG.3. The step 614 is provided on the wall surface 610. The step 614 is recessed from the wall surface 610 in the radial direction and extends in the axial direction up to the inner surface 601. A space formed by the step 614 communicates with the inner space 602. The step 614 corresponds to a member forming the escape space.

The low compression portion 702L goes into space defined by the step 614. The step 614 allows the low compression portion 702L to escape radially outward. The border 702B between the high compression portion 702H and the low compression portion 702L is tightly in contact with the corner 615 between the contact part 611 and the step 614.

In this embodiment, the low compression portion 702L can escape in the step 614, which lowers the compressed state of the low compression portion 702L than the high compression portion 702H. This allows the same effect in the preceding embodiment. Even if the stress influences the grommet 70 in the slipping off direction, the low compression portion 702L that has the big holding power and acts as the anchor can suppress the displacement of the grommet 70.

The low compression portion 702L is not in contact with the housing 60. This enforces the holding power. In addition, the low compression portion 702L is in the non-compressed state. The end of the low compression portion 702L is free. This further enforces the holding power.

The flange 701 may be provided so that the flange 701 faces the inner surface 601. In this case, the step 614 is provided continuous with the outer surface 600 instead of the inner surface 601.

The low compression portion 702L may be in contact with the housing 60, for example the bottom surface of the step 614. The holding force can be increased when the low compression portion 702L is not in contact with the housing 70, and is in the non-compressed state.

Third Embodiment

The third embodiment is a variation based on the preceding embodiment. The waterproof casing in the preceding embodiment has the escape space on the wall surface 610 of the hole 61. The escape space may be an inside or an outside space of the housing 60.

Figure 5:
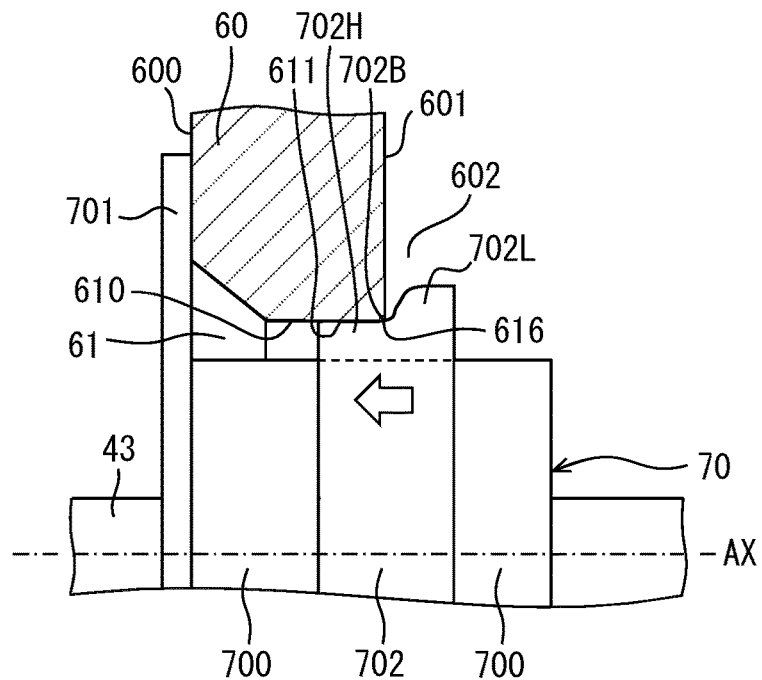
FIG. 5 is a cross section view of a fixed structure of a grommet in a waterproof casing in accordance with the third embodiment.

FIG. 5 illustrates the fixed structure of the grommet 70. FIG. 5 corresponds to FIG. 3. The thickness of the side wall 62 of the housing 60 in FIG.5 is thicker than that in the preceding embodiment. The low compression portion 702L is provided outside the hole 61. The low compression portion 702L is provided inside the inner space 602 of the housing 60. The inner space 602 is formed by the inner surface 601 of the housing 60. The inner space 602 corresponds to the escape space.

The low compression portion 702L is disposed inside the housing 60. The wall surface 610 does not extend to the position where the low compression portion 702L is located. Thus, the low compression portion 702L escapes radially outward from the contact part 611. The border 702B between the high compression portion 702H and the low compression portion 702L is tightly in contact with the corner 616 between the contact part 611 and the inner surface 601.

In this embodiment, the low compression portion 702L escapes in the inner space 602, which lowers the compressed state of the low compression portion 702L than the high compression portion 702H. This allows the same effect in the preceding embodiment. Even if stress influences the grommet 70 in the slipping off direction, the low compression portion 702L that has big holding power and acts as the anchor can suppress the displacement of the grommet 70.

The low compression portion 702L is not in contact with the housing 60, which enforces the holding power. In addition, the low compression portion 702L is in the non-compressed state, which further enforces the holding power. Using the inner space 602 of the housing 60 as the escape space allows the structure of the housing 60 and the producing procedure to be simple.

The flange 701 may be provided so that the flange 701 faces the inner surface 601. In this case, a space outside the housing 60 is to be the escape space for the low compression portion 702L.

Fourth Embodiment

The fourth embodiment is a variation of the preceding embodiments. The lip 702 in the preceding embodiments has the high compression portion 702H and the low compression portion 702L. The lip 702 may have pairs of the high compression portion 702H and the low compression portion 702L.

Figure 6:
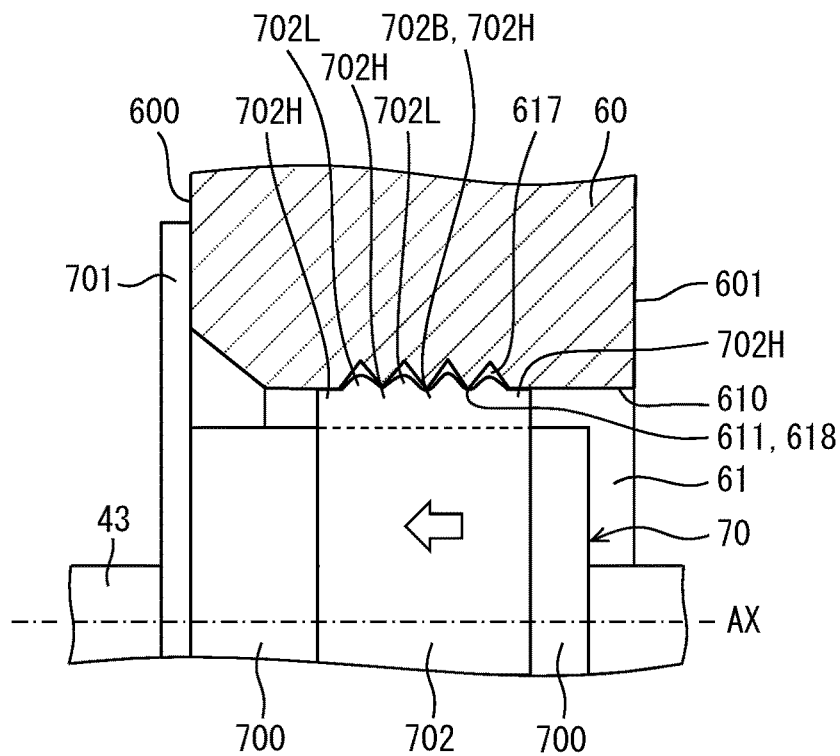
FIG. 6 is a cross section view of a fixed structure of a grommet in a waterproof casing in accordance with the fourth embodiment.

FIG. 6 is the fixed structure of the grommet 70. FIG. 6 corresponds to FIG. 3. The wall surface 610 has plural recesses 617 arranged in the axial direction. When the grommet 70 is inserted into the hole 61, the lip 702 is separated into projections respectively corresponding to the recesses 617. The cross section of each recess 617 in the axial direction is an approximately wedge-shape. Each recess 617 extends continuously along entire inner peripheral part of the wall surface 610. The wall surface 610 has a plurality of grooves.

Each recess 617 acts as the escape space. The lip 702 goes into the each recess 617. The projections of the lip 702 located in the recesses 617 are the low compression portions 702L. The recesses 617 allow the low compression portion 702L to escape radially outward. The connection part of the recess 617 and the contact part 611 is the corner 618. The connection part of the recesses 617 is also the corner 618. A part of the lip 702 in tightly contact with the corner 618 and the plain part of the wall surface 610 that does not have the recesses 617 is the high compression portion 702H.

The waterproof housing in this embodiment allows the low compression portion 702L to escape in the recesses 617, which lowers the compressed state in the low compression portion 702L than the high compression portion 702H. This allows the same effect in the preceding embodiments. Even if stress influences the grommet 70 in the slipping off direction, the low compression portion 702L that has big holding power and that acts as the anchor can suppress the displacement of the grommet 70.

The low compression portion 702L is not in contact with the housing 60, which enforces the holding power. However, the both ends of the low compression portion 702L have the high compression portions 702H. Thus, the low compression portion 702L does not have a free end. The free end makes it easy to be in the non-compressed state.

The flange 701 may be provided so that the flange 701 faces the inner surface 601. The shapes of the cross section of the recesses 617 are not limited to the preceding example. The shapes may be rectangle, trapezoid, and half circle. The low compression portion 702L may be in contact with the wall surface 610 in the recesses 617.

Fifth Embodiment

The fifth embodiment is a variation based on the preceding embodiments. The waterproof housing in the preceding embodiment has the recess 612 on the wall surface 610. The wall surface 610 may be a taper surface in the fifth embodiment.

Figure 7:
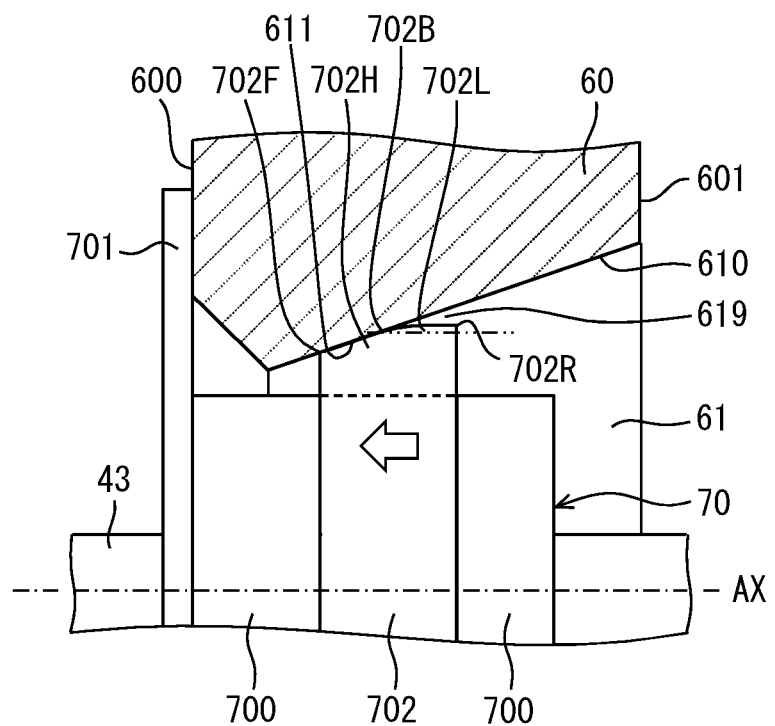
FIG. 7 is a cross section view of a fixed structure of a grommet in a waterproof casing in accordance with the fifth embodiment.

FIG. 7 is the fixed structure of the grommet 70. FIG. 7 corresponds to FIG. 3. The opening width of the hole 61 changes constantly as extending in the axial direction. The opening width gets larger as it separates from the flange 701. In FIG.7, the opening width gets larger as it separates from the outer surface 600, or as it gets closer to the inner surface 601.

The wall surface 610 of the hole 61 inclines with respect to the axial direction. The wall surface 610 is a taper surface. A part of the lip 702 adjacent to the flange 701 is tightly in contact with the wall surface 610, and the other part of the lip 702 is not in contact with the wall surface 610. A part of the lip 702 from the end 702F to the border 702B is the high compressed portion 702H and a part of the lip 702 from the border 702B to the end 702R is the low compression portion 702L. The high compression portion 702H is tightly in contact with the wall surface 610. The low compression portion 702L is not in contact with the wall surface 610. The low compression portion 702L is in the non-compressed state.

The taper wall surface 610 forms the escape space 619 between the wall surface 610 and a virtual plane shown by two-dot chain line in FIG. 7. A part of the lip 702 goes into the escape space 619. In FIG. 7, the low compression portion 702L goes into the escape space 619. The escape space 619 allows the low compression portion 702L to escape radially outward.

In this embodiment, the low compression portion 702L escapes in the escape space 619 formed by the taper wall surface 610, which lowers the compression state of the low compression portion 702L than the high compression portion 702H. This generates the holding power at the border 702B. The low compression portion 702L goes into the escape space 619 and acts as the anchor. This allows the same effect in the preceding embodiments. Even if stress influences the grommet 70 in the slipping off direction, the low compression portion 702L that has big holding power and that acts as the anchor can suppress the displacement of the grommet 70. According to this embodiment, the above effects are obtained without forming a step on the wall surface 610.

At least a part of the low compression portion 702L may be in contact with the wall surface 610. Even in that case, the compression portion 702L can also escape radially outward, which lowers the compressed state of the low compression portion 702L than the high compression portion 702H.

The flange 701 may be provided so that the flange 701 faces the inner surface 601. In this case, the opening width of the hole 61 gets larger as it separates from the inner surface 601, or as it gets closer to the outer surface 600.

Sixth Embodiment

The sixth embodiment is a variation based on the preceding embodiments. The waterproof casing in the preceding embodiments has a housing 60 formed with one component. The housing 60 may be configured with two components in the sixth embodiment.

Figure 8:
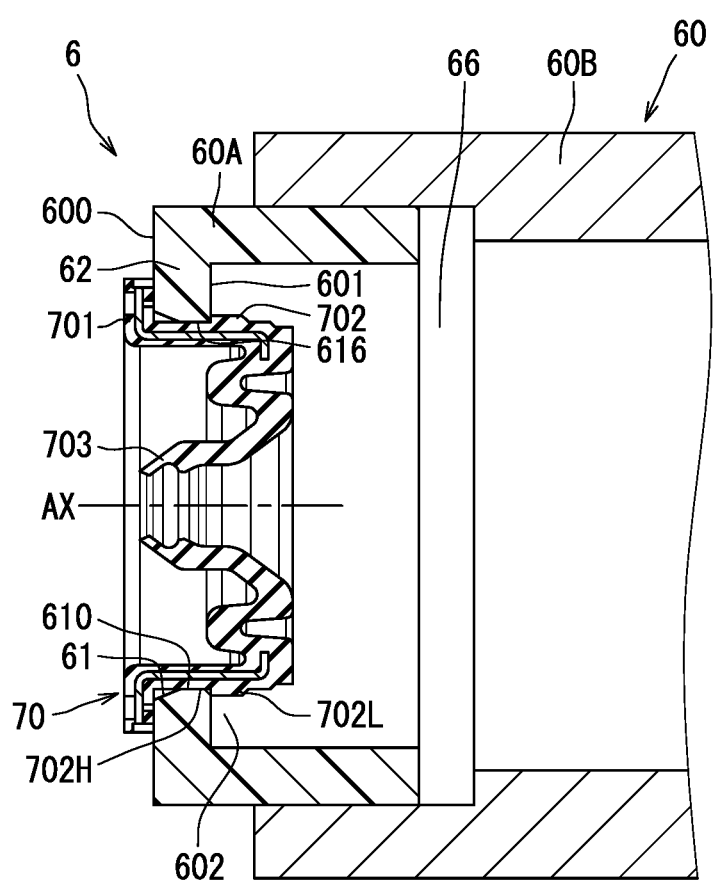
FIG. 8 is a cross section view of a fixed structure of a grommet in a waterproof casing in accordance with the sixth embodiment.

FIG. 8 shows the fixed structure of the grommet 70. FIG. 8 corresponds to FIG. 2. The waterproof casing 6 has a first housing 60A and a second housing 60B. The one waterproof casing 6 is configured by connecting the first housing 60A to the second housing 60B. The first housing 60A has the grommet 70.

The fixed structure of the grommet 70 in the first housing 60A in FIG. 8 is the same with that in the third embodiment. The first housing 60A has the hole 61. The hole 61 is a first hole. The first housing 60A may be bottomed cylindrical, and form the hole 61 on a bottom wall. The bottom wall forms the side wall 62 of the waterproof casing 6. The first housing 60 may be formed by resin.

The grommet 70 is disposed to cover the hole 61. The flange 701 of the grommet 70 faces the outer surface 600 of the first housing 60A. The high compression portion 702H of the lip 702 is tightly in contact with the wall surface 610 that forms the hole 61 with compressed. The low compression portion 702L is disposed outside the hole 61 and inside the inner space 602 of the waterproof casing 6.

The second housing 60B has a second hole 66. The first housing 60A having the grommet 70 is inserted to the second hole 66. The first housing 60A is inserted from the opening of the second hole 66 so that the side wall 62 forms the outer wall of the waterproof casing 6. The first housing 60A is fixed to the second housing 60B with inserted in the second hole 66 with for example, adhesive or glue. The second housing 60B is formed with metal such as aluminum. The second housing 60B is box-shaped.

In this embodiment, the low compression portion 702L escapes in the inner space 602, which lowers the compression state of the low compression portion 702L than the high compression portion 702H. This allows the same effect in the preceding embodiment. Even if stress influences the grommet 70 in the slipping off direction, the low compression portion 702L that has the big holding power and that acts as the anchor can suppress the displacement of the grommet 70.

According to this embodiment, various types of the waterproof casing 6 can use a standard grommet 70 by alternating the first housing 60A. This improves a generality.

The sealing structure of the grommet 70 that connects the waterproof casing 6 having two components is not limited to the example above. The structures in accordance with the first, second, fourth, and fifth embodiments can be combined with this embodiment.

Other Embodiment

The present disclosure in this specification and figures is not limited to the embodiments described above. The disclosure includes the embodiments and various examples of modification based on the embodiments. This disclosure is not limited to the combination of the parts and/or the components described in the embodiments. The disclosure has various examples of combinations. The disclosure can include additional part appropriately as long as there is no harm in the addition. The disclosure includes omitted parts and/or components in the embodiments. The disclosure includes the replacement or the combination of the parts and/or the components between one embodiment and another. The technical range of the disclosure is not limited to the description in the embodiments. The technical range of this disclosure is indicated in the claims and includes all variations in a range of equivalence.

It should be appreciated that the present disclosure in the specification and figures is not limited to the description in the claims. The present disclosure in the specification and figures includes the technical features in the claims and reaches more various and wider ranges of the technical features than technical features in the claims. The disclosure is not limited to the description in the claims and extracts various technical features from the specification and the figures.

An electronic device or an electric device that the waterproof casing 6 is applied to is not limited to the power converter device 100.

The insertion member that the grommet 70 holds is not limited to the pipe 43 for removing air. The grommet 71 that holds the pipe 41 may adopt the seal structure provided in the present disclosure. The present disclosure is applicable to the grommet 71 when the pipe 41 is displaceable in an opposite direction from the side wall 62 by thermal stress.

The insertion member is not limited to pipes. The insertion member may be a wiring such as a signal wiring.

According to the embodiments, the grommet 70 has the cylindrical body 700 and the bellows 703. However, this disclosure is not limited to this. The grommet 70 has at least the body 700, the flange 701, and the lip 702. For example, the grommet 70 may have a hole for inserting the pipe 43 at the center of the body 700 and a diameter of the hole is slightly smaller than the diameter of the pipe 43.

What is claimed is:

1. A waterproof casing comprising:
   a housing having a through hole (i) through a side wall of the housing and (ii) with a center axis; and
   a grommet in the through hole and having elasticity, wherein
   the grommet has:
      a body that extends in an axial direction of the through hole;
      a flange that extends radially outward from the body and faces a surface of the side wall; and
      a lip protruding from an outer surface of the body in a circumferential direction,
   the lip has:
      a central, cylindrical, circumferential outer surface (i) around the center axis and (ii) having a constant diameter in directions parallel to the center axis when the lip is in a non-compressed state;
      a high compression portion in contact with a contact part of a wall surface of the through hole when the lip is in a compressed state; and
      a low compression portion adjacent to the high compression portion and at an opposite side of the high compression portion from the flange in the axial direction and having a lower compressed state than the high compression portion when the lip is in the compressed state,
   the housing has an escape space that allows the low compression portion to expand radially outward, the escape space is adjacent to the contact part of the wall surface, and
   the contact part is between the flange and the escape space.

2. The waterproof casing according to claim 1, wherein the low compression portion is not in contact with the housing.

3. The waterproof casing according to claim 2, wherein the low compression portion is in a non-compressed state.

4. The waterproof casing according to claim 1, wherein the housing has a step forming the escape space on the wall surface,
   the lip has a first end adjacent to the flange and a second end opposite from the first end, and
   the low compression portion is defined by a part of the lip including the second end.

5. The waterproof casing according to claim 3, wherein the low compression portion of the lip is outside the through hole.

6. The waterproof casing according to claim 1, wherein the housing has a plurality of recesses on the wall surface spaced in the axial direction,
   the escape space is defined by each of the plurality of recesses, and
   the low compression portion is in each of the plurality of recesses.

7. The waterproof casing according to claim 1, wherein an opening area of the through hole continuously changes in the axial direction,
   the opening area gets larger as a distance from the flange increases,
   the wall surface is inclined with respect to the axial direction and forms the escape space, and
   the escape space is adjacent to the contact part.

8. The waterproof casing according to claim 1, wherein the housing has:
   a first housing having the through hole; and
   a second housing having a second hole, and
   the first housing is attached in the second hole of the second housing.

9. The waterproof casing according to claim 1, wherein the grommet has a bellows having a cylindrical shape,
   the bellows extends radially inward from the body,
   the bellows is configured to expand and contract in the axial direction,
   the bellows holds an insertion member configured to be inserted in the through hole, and
   an opening end of the bellows is on a same side as the flange.

10. The waterproof casing according to claim 1, wherein the outer diameter of the lip, when the lip is not contact with the housing, is larger than a smallest diameter of the through hole,
   a first part of the lip closer to the flange is compressed by the wall surface of the through hole to be the high compression portion, and
   a second part of the lip on a side of the first part opposite to the flange expands radially outward into the escape space to be the low compression portion.

11. The water proof casing according to claim 9, wherein the bellows does not protrude beyond the flange.

12. The water proof casing according to claim 1, wherein the lip has a first end adjacent to the flange and a second end opposite to the first end, and
   the first end is in contact with the wall surface of the through hole, and the second end is a free end not in contact with the wall surface of the through hole.

13. The water proof casing according to claim 1, wherein
the lip has a border between the high compression portion and the low compression portion, and
the border is tightly in contact with the edge.

14. A waterproof casing comprising:
a housing having a through hole (i) through a side wall of the housing and (ii) with a center axis; and
a grommet in the through hole and having elasticity, wherein
the through hole is defined by (i) an innermost surface portion of the side wall that is cylindrical around the center axis, (ii) a recessed surface portion of the side wall that is cylindrical around the center axis and adjacent to the innermost surface portion, and (iii) a wall extending between the innermost surface portion and the recessed surface portion such that an edge is at a junction of the innermost surface portion and the wall,
a diameter of the recessed surface portion is larger than a diameter of the innermost surface portion,
the grommet has:
a body that extends in an axial direction of the through hole;
a flange that extends radially outward from the body and faces the side wall; and
a lip protruding from an outer surface of the body in a circumferential direction,
the lip has:
a high compression portion in contact with the innermost surface portion such that the high compression portion is in a compressed state; and
a low compression portion (i) adjacent to the high compression portion, (ii) at an opposite side of the high compression portion from the flange in the axial direction, and (iii) facing the recessed surface portion,
the lip is in contact with the edge,
an outer diameter of the lip is larger than the diameter of the innermost surface portion when the lip is not in contact with the side wall, and
the innermost surface portion is between the flange and the recessed surface portion.

15. The waterproof casing according to claim 14, wherein the recessed surface portion is not in contact with the housing.

16. The waterproof casing according to claim 14, wherein the low compression portion is in a non-compressed state.

17. The waterproof casing according to claim 16, wherein the low compression portion includes a lip portion outside the through hole.

18. The waterproof casing according to claim 14, wherein the body has a part between the flange and the lip,
an outer diameter of the part of the body is smaller than the outer diameter of the lip and the diameter of the innermost surface portion.

19. The water proof casing according to claim 14, wherein the wall has a tapered wall surface, and
the tapered surface tapers from the innermost surface portion to the recessed surface portion.

* * * * *